(12) United States Patent
Gerstenmeier

(10) Patent No.: US 12,465,784 B2
(45) Date of Patent: Nov. 11, 2025

(54) IRRADIATION MODULE AND DEVICE AND METHOD FOR IRRADIATION WITH MEDICAL AND COSMETIC RADIATION

(71) Applicant: JK-HOLDING GMBH, Windhagen (DE)

(72) Inventor: Jürgen Gerstenmeier, Neuweid (DE)

(73) Assignee: JK-Holding GMBH, Windhagen (DE)

( * ) Notice: Subject to any disclaimer, the term of this patent is extended or adjusted under 35 U.S.C. 154(b) by 729 days.

(21) Appl. No.: 17/600,653

(22) PCT Filed: Apr. 2, 2020

(86) PCT No.: PCT/IB2020/053142
§ 371 (c)(1),
(2) Date: Oct. 1, 2021

(87) PCT Pub. No.: WO2020/202060
PCT Pub. Date: Oct. 8, 2020

(65) Prior Publication Data
US 2022/0176150 A1    Jun. 9, 2022

(30) Foreign Application Priority Data

Apr. 3, 2019   (CH) .......................... 456/19

(51) Int. Cl.
*A61N 5/06*    (2006.01)
*A61B 5/00*    (2006.01)
(Continued)

(52) U.S. Cl.
CPC ............ *A61N 5/0616* (2013.01); *A61B 5/444* (2013.01); *A61N 5/0614* (2013.01); *F21S 2/005* (2013.01);
(Continued)

(58) Field of Classification Search
CPC .... A61N 2005/0615; A61N 2005/0626; A61N 2005/0639; A61N 2005/0652;
(Continued)

(56) References Cited

U.S. PATENT DOCUMENTS 5,445,608 A * 8/1995 Chen ...................... A61N 5/062
604/20
10,197,261 B1 * 2/2019 Nakamura .............. F21L 14/00
(Continued)

FOREIGN PATENT DOCUMENTS

CN         2695025 Y      4/2005
CN       107249688 A     10/2017
(Continued)

OTHER PUBLICATIONS

China National Intellectual Property Administration, Third Office Action issued in CN Application No. 202080032985.X, mailed Oct. 8, 2024. 19 pages (w/translation).
(Continued)

*Primary Examiner* — Aaron F Roane
(74) *Attorney, Agent, or Firm* — HESLIN ROTHENBERG FARLEY & MESITI P.C.

(57) ABSTRACT

The invention relates to an irradiation module for use in a device (1) for irradiation with medical and cosmetic radiation, comprising a plurality of LEDs arranged on a carrier. The invention also relates to a device for irradiating a user (10) with medical and cosmetic radiation, comprising a plurality of irradiation modules (40) for irradiation with medical and cosmetic radiation, which modules are accommodated in a housing part (20; 30). The invention further relates to a method for irradiating a user (10) with medical and cosmetic radiation, comprising a plurality of irradiation modules (40) for irradiation with medical and cosmetic radiation, which modules are selected from the group com-
(Continued)

prising fluorescent tubes, LEDs, organic LEDs, and high-pressure lamps. In order to provide an irradiation module and a device and a method with which improved irradiation results can be achieved according to the invention, a first group of first LEDs, which emits radiation within the UVA spectrum, and a second group of second LEDs, which emits radiation within the UVB spectrum, are arranged on the carrier.

21 Claims, 2 Drawing Sheets

(51) Int. Cl.
*F21S 2/00* (2016.01)
*F21W 131/20* (2006.01)
*F21Y 115/10* (2016.01)

(52) U.S. Cl.
CPC ............... *A61N 2005/0615* (2013.01); *A61N 2005/0626* (2013.01); *A61N 2005/0639* (2013.01); *A61N 2005/0652* (2013.01); *A61N 2005/0661* (2013.01); *F21W 2131/20* (2013.01); *F21Y 2115/10* (2016.08)

(58) Field of Classification Search
CPC .... A61N 2005/0661; A61N 2005/0637; A61N 2005/0651; F21W 2131/20; F21Y 2115/10
USPC .......................................................... 607/88
See application file for complete search history.

(56) References Cited

U.S. PATENT DOCUMENTS

| | | | | |
|---|---|---|---|---|
| 11,717,698 | B1* | 8/2023 | McGrath, Jr. | A61N 5/0624 607/94 |
| 2004/0075065 | A1 | 4/2004 | Spivak | |
| 2005/0243539 | A1 | 11/2005 | Evans et al. | |
| 2013/0184693 | A1* | 7/2013 | Neev | A61N 5/0616 606/9 |
| 2014/0207215 | A1* | 7/2014 | Fiset | A61N 5/0614 607/94 |
| 2014/0288351 | A1* | 9/2014 | Jones | A61N 5/0624 607/90 |
| 2016/0082280 | A1 | 3/2016 | Ono et al. | |
| 2016/0175550 | A1* | 6/2016 | Taylor | A61M 35/30 128/202.16 |
| 2018/0021593 | A1* | 1/2018 | Vartanian | A61N 5/0618 607/90 |
| 2018/0353770 | A1* | 12/2018 | Moffat | A61N 5/0616 |

FOREIGN PATENT DOCUMENTS

| | | |
|---|---|---|
| CN | 108721788 A | 11/2018 |
| CN | 109200482 A | 1/2019 |
| CN | 109381800 A | 2/2019 |
| DE | 102005010723 A1 | 8/2006 |
| DE | 102017120091 A1 | 2/2019 |
| DE | 102017120092 A1 | 2/2019 |
| EP | 2075034 A1 | 7/2009 |
| EP | 2889054 A1 | 1/2015 |
| EP | 3597268 A1 | 1/2020 |
| JP | 2006059625 A | 3/2006 |
| JP | 2007504925 A | 3/2007 |
| JP | 2011009401 A | 1/2011 |
| JP | 2016059689 A | 4/2016 |
| KR | 20160108804 A | 9/2016 |
| RU | 175693 U1 | 12/2017 |
| WO | 2012011042 A2 | 1/2012 |

OTHER PUBLICATIONS

Japan Patent Office, Notice of Reasons for Rejection issued in JP Application No. 2021-558981, mailed Jul. 23, 2024. 10 pages (w/translation).
Japan Patent Office, Notice of Reasons for Rejections issued in JP Application No. 2021-558981, mailed Oct. 31, 2023. 9 pages (w/translation).

* cited by examiner

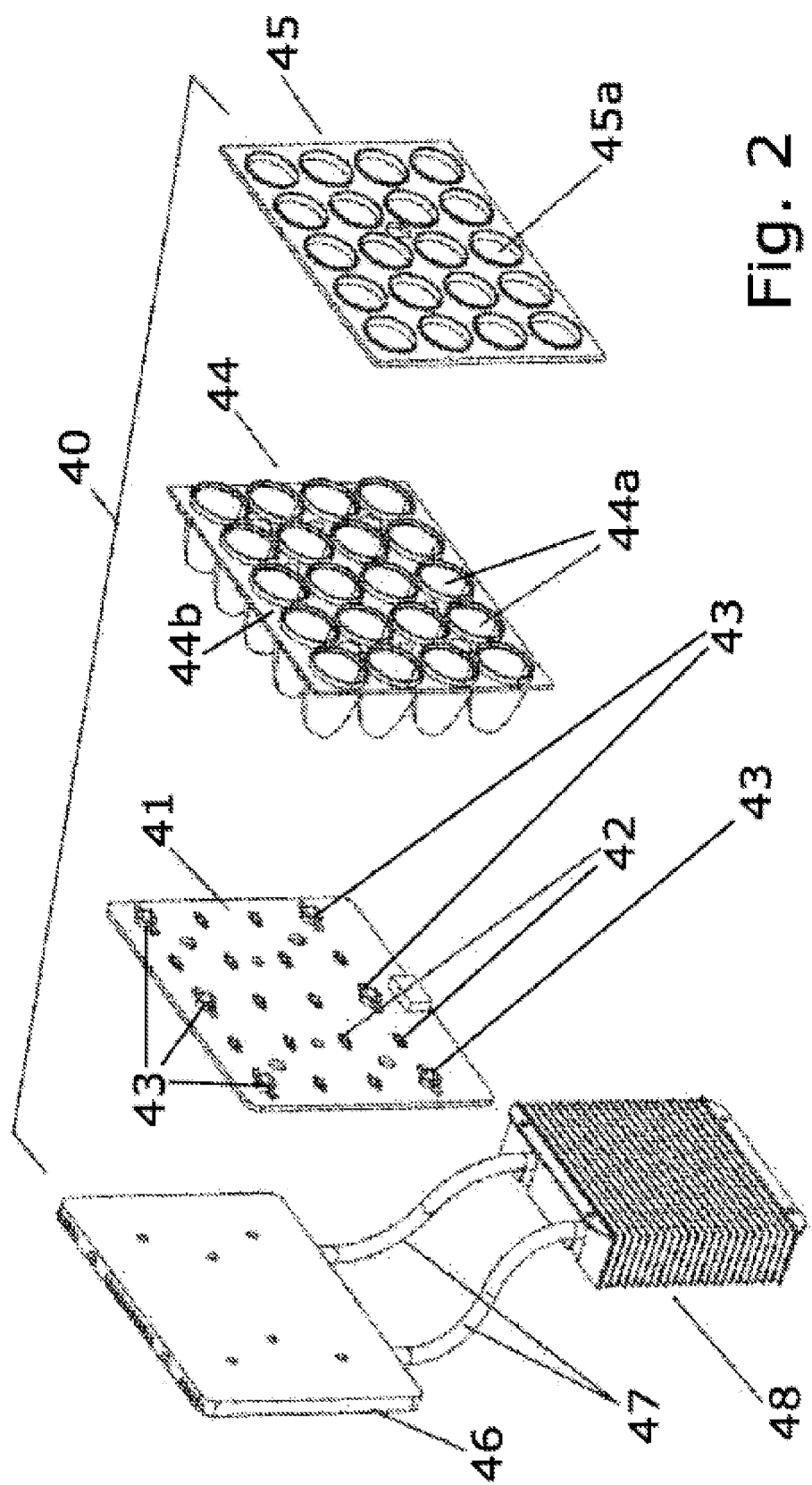

IRRADIATION MODULE AND DEVICE AND METHOD FOR IRRADIATION WITH MEDICAL AND COSMETIC RADIATION

This application is a national stage entry under 35 U.S.C. § 371 of International Application Number PCT/IB2020/053142, filed Apr. 2, 2020, and claims priority to Swiss application CH 00456/19, filed Apr. 3, 2019, the entire contents of which applications are hereby incorporated herein their entireties.

The invention relates to an irradiation module for use in a device for irradiation with medical and cosmetic radiation, comprising a plurality of LEDs arranged on a carrier. The invention also relates to a device and method for irradiation with medical and cosmetic radiation, comprising a plurality of irradiation modules for irradiation with medical and cosmetic radiation, which modules are accommodated in a housing part.

Devices for irradiation with medical and cosmetic radiation are known in practice which are formed particularly as a solarium and with which a user is exposed particularly to ultraviolet radiation, particularly in the UVA spectrum and UVB spectrum, in order to tan skin. The irradiation modules in this case are formed as low-pressure fluorescent tubes or high-pressure lamps which, however, make it necessary to house them in relatively large housing parts and which take up quite a bit of space. Moreover, the fluorescent tubes and high-pressure lamps enable hardly any customized adjustment to the desired irradiation result and particularly do not optimally enable the known devices to be customized for different users, which means that the result of the irradiation is different for thin or heavier persons. Lastly, the known devices consume a lot of energy.

In the area of irradiation of skin, assemblies emitting medical and cosmetic radiation are used, the radiation of which causes a photobiological effect in the person being irradiated. The person's skin is exposed to medical and cosmetic radiation in this case but the radiation cannot penetrate into deeper regions of the body depending on the specific wavelength. The effect comprises, for example, tanning of the skin but also further physiological and psychological effects resulting from the irradiation. Medical and cosmetic radiation comprises the spectrum of ultraviolet (UV) radiation, visible (VIS) radiation, and near-infrared (NIR) radiation. The UV radiation in this case has wavelengths in the spectrum between 100 nm and about 380 nm, the VIS radiation in this case has wavelengths in the spectrum between about 380 nm and about 780 nm, and the NIR radiation in this case has wavelengths in the spectrum between about 780 nm and 1400 nm. The aforementioned spectra may overlap. Depending on the medical and cosmetic application, the irradiation may be concentrated in a partial spectrum of the aforementioned spectra. To this end, assemblies emitting medical and cosmetic radiation can also be assigned to dedicated individual wavelengths, e.g. to UV radiation which is generated by beam tubes. However, the use of a beam tube is not mandatory. Due to the therapeutic effects of the medical and cosmetic radiation, it can also be characterized as medical and cosmetic therapeutic radiation.

The spectrum of UVA radiation ranges from about 380 nm to 315 nm, while the spectrum of UVB radiation ranges from about 315 nm to 280 nm. From 280 nm to about 100 nm is the spectrum of UVC radiation which can cause bodily harm to humans.

Devices for affecting the skin of a user are known in practice as they are used, for example, in tanning salons, in which a person to be irradiated can lie on a cover forming a reclining surface or end surface for the purposes of tanning their skin through pigmentation, in which an assembly emitting UV radiation is arranged underneath the cover normally with a plurality of beam tubes, particularly fluorescent tubes, in which the cover for access to the beam tubes can be removed or pivoted. Such tanning devices usually also have a further modular unit with further beam tubes and a second cover, which can be pivoted jointly to the person to be irradiated so that the person can be tanned from two sides.

So-called stand-up tanning booths are also known in practice, in which the person to be irradiated does not lie horizontally on the cover but instead is in a vertical position surrounded by the assembly emitting the UV radiation. In a stand-up tanning booth, the beam tubes extend particularly in the vertical direction.

The object of the invention is to provide an irradiation module or a device and a method for irradiation, with which an improved irradiation result is respectively achieved.

This object is achieved according to the invention by means of an irradiation module or a device and a method for irradiation having the features of an independent claim.

According to one aspect of the invention, a radiation module is obtained for use in a device for irradiation with medical and cosmetic radiation, which module comprises a plurality of LEDs arranged on a carrier, arranged in which is a first group of LEDs, which emits radiation in the UVA spectrum, and a second group of second LEDs, which emits the radiation in the UVB spectrum. Due to the mixed arrangement of LEDs from the UVA and UVB spectra, a beneficial irradiation result is achieved, in which particularly the LEDs of the UVB spectrum have a much higher photobiological effect than the LEDs of the UVA spectrum. The irradiation module can be arranged in the device for irradiation at various places, for example in the region for irradiating the face, in the region for irradiating the torso, and/or in the region for irradiating the shoulders.

The first LEDs of the UVA spectrum and the second LEDs of the UVB spectrum in this case are formed as different chips which are arranged on the carrier, in which the two LEDs differ as well in terms of their emitting characteristics. The contacting of the LEDs is also implemented differently in this case, in which the LEDs of the first group are preferably actuated jointly, and the LEDs of the second group are also actuated jointly. However, it is also possible to actuate the LEDs individually as well or even to provide several first groups of first LEDs and several second groups of second LEDs.

The carrier is expediently formed as a flat plate which is formed, for example, in a rectangular shape. This makes it possible to easily arrange reflectors downstream with an axis which is normal as relates to the carrier. Alternatively, it is also possible to form the carrier with a curvature such that the LEDs are arranged on a concave side or alternatively on a convex side of the carrier, whereby the irradiation modules as a whole tend to be capable of following the shape of a human body. Alternatively, it is possible to form the carrier as a folded part, in which the LEDs have an angle to one another on the respectively folded flat sections.

The carrier can also have quite large dimensions such that, for example, only one carrier needs to be arranged essentially respectively in a housing part of a device. The shape of the carrier can be designed as desired depending on the intended application. An especially beneficial shape results, for example, when the carrier is formed in the shape of annular segments or as a part of a polygon and thus at least partially adapts a tube for a user. In this case, the LEDs are arranged on the inside of the carrier.

Expediently, the first LEDs amount to between 50% and 90% of the total from the first and second LEDs, and the second LEDs amount to between 50% and 10% of the total from the first and second LEDs. Thus, at least one tenth and no more than half of the LEDs, as the second LEDs, emit the radiation of the UVB spectrum, which is expedient with respect to the significantly higher level of photobiological effectiveness. Ideally, the proportion of first LEDs is between 70% and 80% and the proportion of second LEDs is between 20% and 30%.

If the first LEDs and the second LEDs are provided on the carrier in equal parts, it is especially beneficial if they alternate in the form of a checkerboard pattern. Alternatively, the lines and/or the columns can also be equipped with alternating first LEDs and second LEDs.

The number of LEDs arranged on a carrier can easily amount to several hundred LEDs, which also depends on the size of the carrier. According to one beneficial embodiment, the number of LEDs arranged on a carrier is selected to be between approximately 10 and approximately 600 LEDs, but preferably between 20 and 60 LEDs. Since the LEDs generate noticeable heat, it is expedient to connect the carrier to a heat-transfer plate and to cool down this plate with external means so that the number of LEDs expediently arranged on the carrier, which will be cooled with a cooling device, amounts to 40, for example.

Preferably, 10 or 20 LEDs or an integer multiple thereof is arranged on a carrier, in which two, four, or an integer multiple thereof of LEDs are respectively formed as the second LEDs. This results in good mixing of the radiation generated from the two spectra of the two groups, whereby beneficial tanning of a user results.

Expediently, the LEDs which are arranged on the carrier are exclusively those of the first group and of the second group such that the total of the first LEDs and of the second LEDs results in the total of the LEDs emitting the UV radiation, and the second LEDs amount to 20% of this total.

In one advantageous embodiment, the LEDs are arranged on the carrier in a field comprising four lines and five columns, in which the middle column is expediently formed by second LEDs, while the remaining columns are formed by the first LEDs. This results in a suitable ratio of 80:20 or of 16:4 when there are 20 LEDs, with this ratio achieving beneficial irradiation characteristics. It is possible to arrange several of the irradiation modules next to one another and thus to design whole surface areas with irradiation modules.

The distance between neighboring LEDs in the same column or in the same line is expediently constant and preferably amounts to between 1 cm and 4 cm, especially preferably between 1.25 cm and 2.25 cm, and ideally between 1.5 cm and 2 cm. Reflectors to be provided can thereby be dimensioned sufficiently large enough to homogenize the radiation being emitted by the LEDs and thus to achieve a uniform irradiation result.

Expediently, the first LEDs and/or the second LEDs are equipped with primary optics in the design of a silicone lens which means that the radiation of the LEDs is emitted essentially corresponding to the desired direction. The primary optics bundle the radiation emitted by the LEDs and thus prevent unnecessary losses. Instead of a silicone lens, the primary optics can also be realized in another manner.

Preferably, the second LEDs are actuated at a lower power level than the first LEDs, because the photobiological effect of the second LEDs is significantly greater despite the lower level of efficiency of the second LEDs. This is particularly intended to effectively suppress burns in the person to be irradiated.

The carrier is expediently connected to a heat-transfer plate in order to dissipate the heat resulting from operating the LEDs. The heat-transfer plate in this case is expediently connected to a heat exchanger via cooling lines, which heat exchanger may also be arranged apart from the heat-transfer plate depending on the installation situation. To this end, the heat-transfer plate expediently has channels or capillaries, in which a fluid, which is being routed to the heat exchanger via the cooling lines, can circulate and cool down the plate. The fluid may be a gas, a gas-liquid mixture, or a liquid, in which ventilation slots can, moreover, be arranged in the heat-transfer plate which lead to cooling with ambient air.

In one advantageous refinement, a reflector is assigned to each LED, which reflector is preferably connected to the carrier and by means of which a more uniform discharge of radiation is achieved for the respective LED. The reflector is especially advantageous when the uniform distribution of the radiation cannot be achieved by the primary optics.

The reflectors expediently extend from the LEDs in a taper formation and are preferably arranged in a common modular unit which enables the entire modular unit to be connected to the carrier. In this case, the axes of the reflectors are coordinated expediently to the distances between LEDs such that the modular unit can be concentrated respectively for all LEDs on the carrier. In this case, it is expediently provided that the first LEDs and the second LEDs are equipped with the same reflector so that the first LEDs and second LEDs can be arranged at different positions without the modular unit having to be designed differently.

Expediently, the modular unit with the reflectors, the carrier, and the heat-transfer plate are connected to one another such that they can be jointly used in a device for irradiation. The connection is implemented preferably through threaded screws; however, it is also possible to rivet the aforementioned parts to one another or to connect them to one another in another manner.

According to an especially preferred refinement, it is provided that the modular unit for the reflectors has at least one recess for a third LED without a reflector, which third LED emits the visible radiation. To this end, the LED, which emits red light for example, can be arranged in a region which is surrounded by four reflectors such that the third LED, which emits the visible radiation, can be used for the simultaneous or successive application of light therapy in the device for irradiation.

If the irradiation module is not equipped with reflectors, the third LED, which emits the visible radiation, can also be positioned on the carrier. The third LEDs do not have to be considered when determining the ratio between the first LEDs and second LEDs. Alternatively, it is also possible to equip the third LED with a reflector which can be the same reflector as is used in the first and/or second LEDs, but this is not mandatory.

In one preferred embodiment, it is provided that the heat-transfer plate is connected to the cooling lines via a plug connection. Because of this, the group comprising the heat-transfer plate, carrier, and modular unit of reflectors can be easily replaced, even within a device for irradiation, and a carrier populated with different first LEDs and second LEDs can be used depending on the application case. Moreover, a carrier can then be easily replaced if the LEDs are damaged or cannot be reasonably used due to their characteristics.

In a further advantageous embodiment, one of the cooling lines may also be formed as an electrical conductor for contacting of the LEDs arranged on the carrier such that the electrical contacting is also realized as a type of plug solution at the same time, in addition to the replacement of the carrier.

In a beneficial refinement, the modular unit with the reflectors is equipped with a cover disk which has a number of circular recesses corresponding to the number of reflectors, in which the disk is preferably formed from acrylic glass. The circular recesses in this case are formed flush with the axes of the reflectors and equipped with a florescent layer on the interior circumference thereof, which layer is excited to light up due to the excitation from the radiation being emitted by the first LEDs and/or second LEDs. This manner makes it advantageously possible for a user, who is being exposed to radiation by the irradiation module, to differentiate whether the first LEDs and/or second LEDs, which emit in the non-visible range, are actively emitting radiation or not. The disk is expediently screwed in together with the assembly comprising the heat-transfer plate, carrier, and modular unit so that, in the event there are third LEDs provided in the disk, drill holes are also preferably provided for the passage of the visible radiation thereby emitted. It is possible to select the fluorescent layer such that it lights up in a color that has a photo-therapeutic effect on the human body.

A beneficial use of an irradiation module is provided in a unit for tanning the shoulders. A further beneficial use of an irradiation module is provided in a unit for tanning the face. A further beneficial use of an irradiation module is provided in a device for tanning the entire body, particularly the torso, the arms, and the legs of a user.

According to one aspect of the invention, a device for irradiation with medical and cosmetic radiation is characterized in that at least one irradiation module is provided therein as previously described. It is possible to arrange a plurality of irradiation modules in the device, which are next to one another and enclose a tunnel or a tube, in which a user can be standing or lying down, particularly in order to tan the skin due to the exposure to radiation.

The irradiation modules advantageously have small dimensions and low weight so that they are easy to install and/or to replace. The device then advantageously provides means for the electrical connection of the irradiation modules, which can be used and connected or also disconnected or removed depending on the intended application.

The device expediently has a row of plug-in slots, at which, for example, the previously described irradiation modules, but also other modules, can be connected such as those with third LEDs from the visible spectrum. In this manner, the device can optionally be operated as tanning equipment when the aforementioned irradiation modules or other irradiation modules are used or as light-therapy equipment when modules with third LEDs from the visible spectrum are connected. The device can also be easily converted specific to a user due to the modularity. To this end, it is advantageously provided that a controller detects the modules used and ensures that they are operated in a permissible manner. In this manner, a defective module can be easily exchanged and replaced.

According to one aspect of the invention, a device is obtained for irradiation with medical and cosmetic radiation, comprising a plurality of irradiation modules for irradiation with medical and cosmetic radiation, which are housed in a housing part, in which at least one of the irradiation modules can be adjusted in the direction of a user individually or together with other irradiation modules within the housing part. This advantageously means that the irradiation modules and thus the device can be adapted to a body contour thus enabling irradiation of a user positioned in the device in a manner beneficial to energy consumption, in which particularly an adaptation to the body shape of the user is possible. For tall or hefty users, the irradiation module is retracted in order to prevent burns on the skin or exceeding of the irradiation dose. For short or slender users, the irradiation module is pushed forward in order to achieve an optimum irradiation result. In addition to the substantially axial adjustability in the direction of the body of the user, it is also possible to arrange the irradiation module in a pivotable manner and thus to move it back-and-forth, whereby it is possible to homogenize the irradiation result. At the same time, the irradiation modules have the ability to irradiate difficult-to-reach zones such as, for example, shoulders or body cavities at various angles and thus tan them.

The irradiation modules in this case are optionally adjusted pneumatically, hydraulically, or mechanically, e.g. by means of a toothed rack or a spindle/spindle-nut system, in which expediently the drive is provided with an electric motor since the device is already operated with electrical energy. If several irradiation modules are to be moved toward the body of the user, it is expediently provided that the transitions between neighboring modules are sealed off by means of a seal, for example of a membrane coating, in order to prevent difficulties when cleaning. However, it is also possible to move entire sections of the housing part as a whole once the tube or the tunnel is formed, in which the housing part is then arranged comparatively close to the body. The irradiation modules are then adjusted within the housing part in the direction of the body of the user in order to achieve a beneficial result of the irradiation with low energy consumption due to the optimization of the distance.

In order to beneficially enable a three-dimensional adjustment of the irradiation modules, the irradiation module is expediently formed with a honeycomb-shaped carrier, which forms, for example, a hexagonal surface, in which an adjacent honeycomb body is respectively connected to each edge. Alternatively, a carrier with a different shape may be provided with the hexagonal carriers in order to achieve a spherical curvature.

According to another alternative embodiment, the carriers with the LEDs can also be attached to a three-dimensional surface which enables a flexible adjustment, whereby it is not the individual irradiation module but the surface as a whole which is formed to be movable.

According to one advantageous embodiment, it is provided that means are provided for measuring the distance between the user and the at least one irradiation module, which means are expediently arranged in the housing part such that the distance between the user and the housing part is possible at one characteristic point or several points which result in an outline of a body. The means for measuring the distance of the user may be optical means; however, it is also possible to provide a scale such as, for example, a checkerboard pattern on a housing part, which enables the measurement of the body of the user and thus the determination of the distance away from the respective irradiation modules. The scale can also be determined by the measuring means in an image reflected by the housing part.

The irradiation module is then expediently adjustable in the direction of the user such that the irradiation module maintains a preset, optimal distance away from the user instead. This distance, which may also be predefined for safety reasons, enables an especially beneficial result of the radiation while simultaneously maintaining limit values of the irradiation and the lowest possible energy consumption at the same time. The irradiation modules in this case are expediently operated at a preset power level, and the irradiation result in this case is substantially optimized due to the adjustment to the body of the user.

Neighboring irradiation modules are expediently sealed off to penetration by contaminants by means of a flexible membrane. Specifically when the individual irradiation modules are moved different distances away, there is the risk of gap formation between neighboring modules into which the contaminants can penetrate. To this end, it is necessary to select a seal which is also resistant to medical and cosmetic radiation, particularly the UV proportion thereof.

Preferably, it is also provided, however, that the irradiation modules are displaced within the housing part such that the seals are enabled due to the housing part formed from acrylic glass.

The irradiation modules are preferably in the form of a rectangle, particularly a square. The surfaces can then be formed from a plurality of irradiation modules in a simple manner. Alternatively, the irradiation modules may also be formed in the shape of a honeycomb or circle or have a sphere which enables the radiation to be directed especially efficiently in the direction of the user.

According to one aspect of the invention, a device is obtained for irradiating a user with medical and cosmetic radiation, comprising a plurality of irradiation modules for irradiation with medical and cosmetic radiation, which are housed in a housing part, in which the irradiation modules have a plurality of LEDs, which emit radiation in the UVA spectrum and/or the UVB spectrum, in which the LEDs can be actuated individually or jointly, particularly in groups of LEDs, with the same spectrum, in order to irradiate with a definable intensity. A device is advantageously hereby obtained which enables the irradiation of the user with medical and cosmetic radiation point-by-point or over a surface in that only the LEDs which are required for a desired irradiation are used. This not only enables the saving of energy and provides protection to the body of the user, but also certain programs can be set for the irradiation due to the individual or grouped actuation of the LEDs; for example, the LEDs can be used in a pulsed manner, or an exposure to different radiation intensities is achieved depending on the region of the body.

According to a preferred embodiment, a surface of the device occupied by a user is detected, and the LEDs assigned to the unoccupied surface are optionally actuated at reduced power or not at all. Thus, the LED or the radiation module which is assigned to the foot region can be actuated or switched off, for example, in response to the varying body size. For a tall person, the irradiation power is necessary in the foot region while this radiation is not useful for a shorter person. This expediently saves energy and also reduces the heat development in the device. In a corresponding manner, the LEDs or the irradiation modules can be actuated for people of different widths.

In an especially expedient refinement, it is provided that the device has an input unit, particularly a touch display, which can be used to select or define the body zones of a user to be irradiated with reduced intensity and that the controller, in response thereto, reduces the power of the LEDs or irradiation modules. Particularly with the point-by-point LEDs, the regions can be ascertained in sharp outline, which is difficult for irradiation modules formed as fluorescent tubes. Moreover, the actuation of the LEDs is possible with comparatively linear characteristics such that a practically infinitely variable adjustment of the irradiation intensity of the LEDs is possible.

According to one aspect of the invention, a device is obtained for irradiating a user with medical and cosmetic radiation, comprising a plurality of irradiation modules for irradiation with medical and cosmetic radiation, which are housed in a housing part, in which means for detecting the user to be irradiated are provided, and in which the irradiation modules or individual radiation sources of the irradiation modules can be actuated as a function of characteristics of the detected user. A device is hereby advantageously obtained which characterizes the position and characteristics of the body of the user and coordinates the radiation power of the irradiation modules to the position and/or characteristics of the body, particularly the dimensions. Potentially unnecessary radiation sources can hereby advantageously be operated at reduced power or without power, whereby energy consumption is reduced. Moreover, the radiation modules can be optimally adjusted with respect to the distance thereof from the body, which is normally at a distance of about 20 cm to 30 cm away from the body surface. Depending on the shape of the body of the user, for example thick or thin, the irradiation modules are operated with the necessary intensity and/or with the necessary distance of the irradiation modules from the body so that an individually optimized irradiation is achieved for each user. In contrast with the solution known from the prior art, in which the irradiation modules are configured based on an enveloping sphere of the body which does not exceed the body in order to prevent irradiation harmful to health, the device enables an individual adaptation to the body so that particularly thin persons, who have a greater distance away from the imaginary enveloping sphere, are provided with a sufficient irradiation dose.

Expediently, a sensor is provided which detects the body of the user in order to detect a user to be irradiated. In a simple embodiment, this may be a camera which compares an image of the device with and without the user and determines, starting from here, which irradiation modules or LEDs are not required. The camera may be formed as a CCD line-scan camera to prevent the images of the user from being misused. Alternatively, the camera can also be configured particularly for the radiation emitted by the irradiation modules so that those illumination modules or LEDs which are not shaded by the body of the user are detected by the camera. In order to enable better identification of the individual modules or LEDs, they can be actuated at certain frequencies which enable a clear assignment of the irradiation module or the LED to a particular location by means of the camera's evaluation circuit provided in the controller.

According to one aspect of the invention, a device is obtained for irradiating a user with medical and cosmetic radiation, comprising a plurality of irradiation modules for irradiation with medical and cosmetic radiation, which are housed in a housing part, in which a sensor is provided, which detects the radiation being emitted by the irradiation modules, and in which the irradiation modules can be actuated by a controller with modified operating parameters in response to a deviation in the detected radiation by a definable value of radiation, in order to adapt the emitted radiation to the definable value. A device is advantageously hereby obtained which dynamically enables an adaptation of the irradiation modules to a predefined radiation power. This prevents the maximum permissible radiation intensity for a user from being exceeded due to irradiation modules potentially being too strongly adjusted. Such an excessively high radiation intensity can also occur due to the fact that individual radiation sources of the irradiation modules, particularly the LEDs, change their radiation characteristics over the course of the time of operation and atypically do not irradiate with less intensity but with increasing intensity. The associated exceeding of the radiation dose for a user is reliably detected by the sensor and prevented by adapting the emitted radiation downward to the definable value. The reverse may also occur such that an irradiation module does not reach the definable value of radiation due to age or other effects. In this case, the controller enables a compensation of the radiation with the result that the desired irradiation result is reliably ensured each time. In contrast with the solutions from the prior art, in which a correction of the actuation of the irradiation modules is implemented via experimentally determined characteristic curves in the radiation characteristics, the regulation is dynamically and practically possible before or after each irradiation process and even during the irradiation process. In this manner, particularly deviations which occur over the course of the day can be advantageously compensated for. Thus, with some devices for example, it has been observed that the radiation intensity is less after the approach of the device after a longer downtime over a first period of time than the average radiation intensity subsequently discharged. At the same time, it has been determined that the radiation intensity also depends on the ambient temperature of the device such that different values result depending on the climate-control of the device. Finally, it has been determined that the empirically ascertained characteristic curves only enable an approximate adaptation to the power losses from aging and that the dispersion is large enough that the irradiation doses individually created are too high or too low. Particularly in practice there is a problem that sometimes not all irradiation modules are replaced but only a few, for example the beam tubes which are already flickering at an optically perceptible level. If the controller then aligns itself to the characteristic curve of the new beam tubes, the power of the remaining old fluorescent tubes is too weak and vice versa. The dynamic regulation of the radiation intensity enables a result corresponding to the definable value of the radiation even with such a case where the irradiation modules are mixed.

According to a first preferred embodiment, it is provided that the irradiation modules are operated at a constant voltage, and the irradiation modules are then actuated by means of pulse-width modulation. When deviations are detected, the pulse width can hereby be adapted, and the radiation intensity of the irradiation modules can be set.

According to another preferred embodiment, it is provided that the irradiation modules are operated at a constant current and that the irradiation modules are actuated by means of modifying the current strength. The radiation intensity can hereby be continually modified to the definable value.

The features of the previously described devices and irradiation modules can also easily be combined in a common device such that a device which particularly also combines several of the aforementioned features is a subject matter of the present disclosure.

According to one aspect of the invention, a method for irradiation with medical and cosmetic radiation is obtained, particularly in a device as previously described, comprising a plurality of irradiation modules for irradiation with medical and cosmetic radiation, which modules are selected from the group comprising fluorescent tubes, LEDs, organic LEDs, and high-pressure lamps, in which the irradiation modules optionally emit only a partial spectrum of the medical and cosmetic radiation, particularly the previously described partial spectrum for UVA radiation and/or the previously described partial spectrum for UVB radiation. A sensor is provided in this case which detects the radiation being emitted by the irradiation module, and the irradiation modules are actuated by a controller with modified operating parameters in response to a deviation in the detected radiation by a definable value of radiation, in order to adapt the emitted radiation to the definable value. A simple and reliable regulation of the radiation intensity of individual radiation sources, of individual radiation modules, or of the entire device is hereby achieved such that it is ensured that the user is not exposed to any higher irradiation dose than desired or permissible; at the same time however, it is also ensured that the irradiation dose is sufficiently great enough to achieve the effect of the irradiation, which is normally tanning of the skin.

Expediently, the sensor has high sensitivity to radiation in the UV spectrum which also represents a hazard source with prolonged exposure of the human body, contrary to the visible radiation. This reliably prevents particularly the spectra of medical and cosmetic radiation associated with the risk of burns from being set incorrectly.

Expediently, at least one further sensor is provided which optionally detects the same spectrum or a spectrum different therefrom, just as the first sensor.

It is preferably provided that one or more of the irradiation modules has its own sensor respectively assigned and that the irradiation modules can be switched on and off individually as well in order for specific radiation intensities to be detected by the sensor for each module. It is possible, for example, to adjust an individual LED to an irradiation module comprising LEDs with respect to the radiation intensity. However, preferably the entire irradiation module is adjusted, which is normally sufficient to due to the similar type of LEDs used, in order to prevent a deviation from the definable radiation values.

It is possible to actuate the irradiation modules or the LEDs of the irradiation modules in individual segments corresponding to the body regions in order to adjust the irradiation results, which is normally tanning of the skin, according to the sensitivity of the skin. It is possible to detect the sensitivity of the skin before tanning or during tanning with a specific detector.

It is possible to provide a plurality of sensors in the device which plurality can reliably monitor a respective region corresponding to a body region of the user.

According to one aspect of the invention, a method is obtained for irradiating a user with medical and cosmetic radiation, particularly as previously described, comprising a plurality of irradiation modules for irradiation with medical and cosmetic radiation, which modules are selected from the group comprising fluorescent tubes, LEDs, organic LEDs, and high-pressure lamps, in which the irradiation modules optionally emit only a partial spectrum of the medical and cosmetic radiation, in which a user sensor is provided which detects the body characteristics of the user, and in which the irradiation modules can be actuated by a controller with operating parameters which adapt the emitted radiation to detected body characteristics, in response to body characteristics detected by the user sensor. It is hereby possible to detect user-specific parameters by means of a user sensor and to adjust the device and particularly the irradiation modules to the user and the user's body characteristics in response to the recorded data. The irradiation is advantageously effectively hereby designed, and it is ensured that device settings which are harmful to the user are prevented.

The user sensor makes it possible to consider user-specific information for the method, for example the dimensions of the user's body or certain characteristics of this body. Thus, irradiation adapted to the individual is possible. The individual setting parameters of the user can preferably be stored in a memory of the device or of the user and downloaded as needed.

According to a first preferred embodiment of the method, it is provided that the user sensor determines the characteristics of the body, selected from the group comprising the height, the width, and the circumference of the body, and the position and/or the intensity of the irradiation modules is adapted to the detected characteristics. The position of the irradiation modules can be modified through adjustment in the direction toward the body, in which means for expediently adjusting the controller are displaced according to the defined distance from the body. The intensity of the irradiation modules can be set by the controller, in which an especially effective adaptation to the body characteristics is achieved, particularly with an embodiment of the irradiation modules as a carrier with a plurality of point-by-point LEDs.

According to a further preferred embodiment, it is provided that the user sensor detects the position and/or the type of skin characteristics of the body of the user, selected from the group comprising tattoos, burns, wounds, birthmarks, scars, white spots, pigment aberrations, tanning, and skin type, and the position and/or the intensity of the irradiation modules is adapted to the detected skin characteristics. It is thus possible, for example, to compensate for increased absorption behavior with respect to the medical and cosmetic radiation due to tattoos or birthmarks in that the radiation intensity of the irradiation modules or of the LEDs preferably provided therein is reduced. In the same manner, places in the skin which are not capable of achieving tanning through pigmentation, particularly due to scars, white spots, pigment aberrations, or wounds, are likewise irradiated at reduced power in order to reliably prevent damage to the skin or the subcutis. Finally, the user sensor can also detect the skin type and the tan level, particularly the pigmentation of the skin, and adjust the irradiation modules based on the detected skin characteristics. When the user sensor detects the skin of the user's body multiple times, it is also possible to ascertain the skin type and any tan level of the user.

Preferably, the irradiation modules have LEDs which are operated in a pulsed manner, at least temporarily. The pulsed operation of the LEDs makes it possible to stimulate photobiological effects of the body of the user.

The previously indicated methods according to the invention can particularly also be formed as a method for operating the device for irradiation, particularly the previously indicated device, such that a method for operating a device for irradiation results which has the features of the aforementioned method.

Further advantages, features, properties, and refinements of the invention result from the following description of a preferred exemplary embodiment, as well as from the dependent claims.

The invention is explained in greater detail in the following with reference to the accompanying drawings and by means of a preferred exemplary embodiment.

FIG. 2 shows an exploded view of an irradiation module according to the invention which is installed in the device from FIG. 1.

Figure 1:
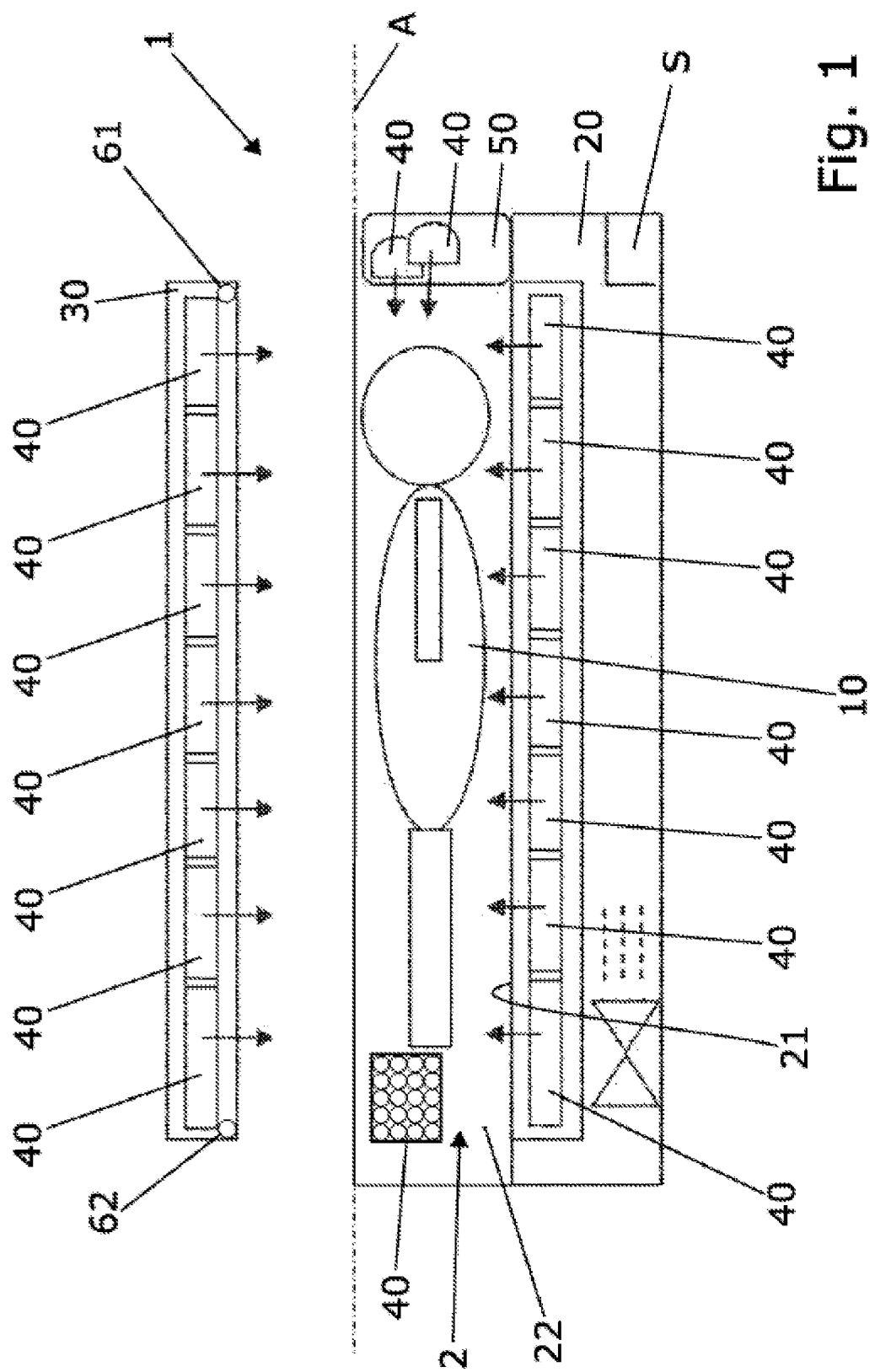
FIG. 1 shows a schematic side view of a preferred exemplary embodiment of a device according to the invention for irradiation.

FIG. 1 shows a device for irradiating a user, which is schematically indicated with the user's human body 10, with medical and cosmetic radiation, which device comprises a lower housing part 20 and an upper housing part 30, which are connected to one another in an articulated manner along an axis A. The upper housing part 30 can be pivoted upward in order to allow free access for the user 10 and can be pivoted downward so that the housing parts 20, 30 enclose a tunnel-like tube 2, in which the user 10 is lying.

The housing parts 20, 30 are encapsulated in acrylic glass, in which a reclining surface 21 made of acrylic glass is formed for the lower housing part 20. It is possible to equip the reclining surface with a silicone mat which is connected to the reclining surface 10, which mat is flexible and provides pleasant haptics for the person 10. The acrylic glass and the silicone mat are permeable respectively to at least parts of the medical and cosmetic radiation.

Irradiation modules 40, which are directed toward the tube 2 in the housing parts 20, 30, are respectively arranged in the lower housing part 20 and the upper housing part 30. The irradiation modules 40 are constructed in rectangular shape and arranged next to one another in the lower housing part 20, parallel to the reclining surface 21. In addition, irradiation modules 40 which can irradiate the person 10 are likewise provided on the vertical section 22 of the lower housing part 20, which vertical section is approximately perpendicular to the reclining surface 21. A plurality of irradiation modules 40 are arranged pushed against one another respectively in a row in the upper housing part 30, in which the irradiation modules arranged in a row are at an angle as relates to the adjacent row in order to trace the semicircular contour of the upper housing part 30 within the housing part 30. The angle is between 5° and 25°, preferably about 10°, depending on the radius and size of the irradiation modules.

Shoulder-tanning equipment 50, which particularly irradiates the head and shoulders of the user 10, is arranged at the top end of the tube 2, in which two further irradiation modules 40 are arranged within the shoulder-tanning equipment 50.

The irradiation modules 40 are connected to a controller S of the device 1.

FIG. 2 shows an exploded view of a control module 40. The figure shows that a plurality of a total of 20 LEDs 42, 43 are attached on a carrier 41, which are contacted via the carrier 41, with an electrical energy supply. It is also possible to provide the LEDs in a different quantity and/or arrangement than the 4×5 field shown here.

The figure shows that a total of six LEDs 43 are arranged on the carrier 41 which emit radiation in the UVB spectrum, while the remaining ten LEDs 42 emit radiation in the UVA spectrum.

A modular unit 44 with 20 identically formed reflectors 44a is provided upstream of the carrier 41 with the LEDs 42, 43, in which the hole size of the reflectors 44a is matched to the LEDs 42, 43. To this end, the reflectors 44a are connected to a disk 44b, which has perforations for the reflectors 44a, in a region spaced apart from the LEDs 42, 43 such that the modular unit 44 can be handled like a part.

An annular disk 45, which has a number of circular recesses 45a in a plate body, which number corresponds to the number of reflectors 44a, is positioned upstream of the modular unit 44, with the recesses being coated with a fluorescent material in the interior thereof. If the LEDs 42, 43 are excited to the point of emitting radiation, this radiation excites the fluorescent material of the rings 45a, and it is evident that the LEDs 42, 43 also emit radiation due to the illumination of the rings 45a taking place in the visible range.

A heat-transfer plate 46, which is formed as a plate body and is intended to dissipate heat resulting during operation of the LEDs 42, 43, is arranged on the side of the carrier 41 turned away from the LEDs 42, 43. To this end, the heat-transfer plate 46 is connected to a cooling body 48 formed as a heat exchanger via a first cooling line 47 and a second cooling line 47, in which a circulating cooling fluid is provided between the heat-transfer plate 46 formed with cavities, the first cooling line 47, the cooling body 48, and the second cooling line 47. The cooling of the heat-transfer plate 46 can particularly be implemented by means of phase conversion of the cooling fluid between the heat-transfer plate 46, on one side, and the cooling body 48, on the other side.

The irradiation modules 40 installed in housing part 20 or housing part 30 are all structurally similar; however, it is understood that the irradiation modules may also be differently constructed and/or actuated as a function of the light sensitivity of certain parts of the user 10.

A first sensor 61, which detects the characteristics of the body of the user 10, particularly the height, width, and circumference thereof as well as the position of the arms and legs, is provided in the upper housing part 30. The radiation of the irradiation modules 40 is set according to the detected characteristics of the body. For example, the irradiation module 40 which is turned away from the top end can thus be completely switched off if the legs of the user do not cover this irradiation module 40.

Alternatively or additionally, the sensor 61 can detect certain skin characteristics of the body of the user 10, for example the presence of tattoos, burns, wounds, birthmarks, scars, white spots, pigment aberrations, the current tan level, and also the skin type. This second sensor, which is also formed as a camera and to which evaluation logic is connected, detects the coloring and contrast of the skin with great resolution and evaluates the recorded images in order to determine the aforementioned characteristics of the body. The evaluation module 40 is then operated at a reduced power as a function of the skin characteristics when there is a risk of burning the skin while under the effect of normal radiation and exposure.

Finally, a second sensor 62 is also arranged in the upper housing part, which sensor detects the radiation from the irradiation modules 40 or the corresponding LEDs 42, 43. The second sensor 62 or the evaluation unit thereof compares the detected radiation to target values, for example, stored in the controller S, and the controller implements an adjustment of the operating parameters of the irradiation modules 40 in response to a deviation in the detected values from the target values, such that there is an adjustment to the target value.

The invention has been explained previously by means of an exemplary embodiment, in which the irradiation module is equipped with two types of LEDs 42, 43 which emit different ultraviolet spectra. It is understood that further LEDs having a spectrum different from the two LEDs 42, 43 may likewise be provided in the irradiation module.

The invention has been explained previously by means of an exemplary embodiment, in which the irradiation module has six LEDs 43 in the UVB spectrum and 14 LEDs in the UVA spectrum. It is understood that the number of LEDs in the corresponding spectrum may also be divided up differently according to the application case.

The invention has been explained previously by means of an exemplary embodiment, in which the carrier 41 of the irradiation module 40 is formed substantially in rectangular shape and has a field of 4×5 LEDs 42, 43. It is understood that the carrier 41 may also have a different shape, for example square or hexagonal, and that the LEDs 42, 43 may also be arranged differently on the carrier 41.

The invention has been explained previously by means of an exemplary embodiment, in which the carrier 41 is connected to a heat-transfer plate 46, which is connected to a heat exchanger via cooling lines 47. It is understood that the heat exchanger 48 may be connected to a further carrier 41 at the same time via further cooling lines, and that it is also possible to connect several heat-transfer plates to the heat exchanger 48 via connecting lines to a closed system.

The invention has been explained previously by means of an exemplary embodiment, in which all irradiation modules 40 in the device 1 are formed in the same manner. It is understood that the irradiation modules 40 for the shoulder and head region, the irradiation modules in the lower housing part 20, and the irradiation modules in the upper housing part 30 may also be formed respectively differently and may particularly also have a different number of LEDs.

The invention has been explained previously by means of an exemplary embodiment, in which the irradiation modules 40 are arranged fixed in position in the housing parts 20, 30, and are actuated essentially in response to data detected by the first sensor 61 and the second sensor 62. It is understood that, instead of an electrical actuation of the irradiation modules 40, they can also be adjustable with respect to their distance from the body of the user 10, for example via pneumatic, hydraulic, mechanical, or electrical adjusting devices.

The invention has been explained previously by means of an exemplary embodiment, in which the device 1 has a stationary lower part 20 and an upper housing part 30 which can be pivoted down to the lower part 20, in which the user 10 rests on a reclining surface 21 of the lower housing part 20. It is understood that the device may also be formed in the shape of a stand-up tanning booth, In which the two housing parts are arranged substantially perpendicular to one another, and in which the user is essentially standing on the floor and is surrounded by the housing parts during the irradiation.

The invention has been explained previously by means of an exemplary embodiment, in which a sensor 61, 62 detects the characteristics of the device 1 or of the person 10. It is understood that several sensors may also be provided for this and that the data obtained by the sensors can also be stored in order to document the proper adjustment of the device.

The invention claimed is:

1. A device for irradiating a user with medical and cosmetic radiation, comprising:
   a plurality of irradiation modules for irradiation with medical and cosmetic radiation, which irradiation modules are housed in a housing part, each irradiation module of the plurality of irradiation modules comprising:
   a carrier upon which a plurality of light emitting diodes (LEDs) are positioned on one side of the carrier, and
   a heat transfer plate arranged on an opposing side of the carrier, the heat transfer plate configured to dissipate heat resulting during operation of the LEDs;
   wherein at least one of the irradiation modules is adjustable in the direction of the user, individually relative to other irradiation modules within the housing part, a sensor configured to detect the position of skin characteristics of the body of the user, the skin characteristics selected from a group comprising of tattoos, burns, wounds, birthmarks, scars, white spots and pigment aberrations;

a controller coupled to the sensor and the plurality of irradiation modules;

wherein, once the position of the skin characteristics of the body of the user are detected, the controller is configured to irradiate the position of the skin characteristics of the body at a reduced power relative to the other positions of the body.

2. The device of claim 1, wherein means are provided for measuring the distance between the user and the at least one irradiation module, and at least one irradiation module is adjustable in the direction of the user such that the irradiation modules maintain a preset distance away from the user.

3. The device of claim 1, wherein neighboring irradiation modules are sealed off to penetration by contaminants by means of a flexible membrane.

4. The device of claim 1, wherein the irradiation modules are formed in the shape of a triangle, square, or honeycomb.

5. The device of claim 1, wherein the plurality of LEDs emit radiation in the UVA spectrum and/or in the UVB spectrum, and the LEDs can be actuated individually or together in order to radiate with a definable intensity.

6. The device of 5, wherein a sensor is provided which is configured to detect which irradiation modules of the plurality of irradiation modules are not shaded by the body of the user.

7. The device of claim 1, wherein an input unit is provided for the user, and in that the user can select regions in which the LEDs assigned to the selected region are actuated at reduced power or not at all.

8. The device of claim 1, wherein a sensor, which detects the body of the user, is provided for detecting a user to be irradiated.

9. The device of claim 1, wherein the device is for irradiating a user with medical and cosmetic radiation, the device comprising a plurality of irradiation modules for irradiation with medical and cosmetic radiation, which modules are housed in a housing part, wherein a sensor is provided which detects the radiation being emitted by the irradiation modules, and in that the irradiation modules can be actuated by the controller with modified operating parameters in response to a deviation in the detected radiation by a definable value of radiation, in order to adapt the emitted radiation to the definable value.

10. The device of claim 9, wherein the irradiation modules are operated at a constant voltage, and in that the irradiation modules are actuated by means of pulse-width modulation.

11. The device of claim 9, wherein the irradiation modules are operated at a constant current, and in that the irradiation modules are actuated by means of modifying the amperage.

12. A method for irradiating a user with medical and cosmetic radiation using a device according to claim 1, comprising irradiating the user with a plurality of irradiation modules for irradiation with medical and cosmetic radiation, which modules are selected from the group comprising fluorescent tubes, LEDs, organic LEDs, and high-pressure lamps, wherein the irradiation modules emit only a partial spectrum of the medical and cosmetic radiation, wherein a sensor is provided which detects the radiation being emitted by the irradiation modules, and in that the irradiation modules can be actuated by the controller with modified operating parameters in response to a deviation in the detected radiation by a definable value of radiation, in order to adapt the emitted radiation to the definable value.

13. The method of claim 12, wherein the sensor has a high level of sensitivity to radiation in the UV spectrum.

14. The method of claim 13, wherein a further sensor is provided for detecting the medical and cosmetic radiation.

15. The method of claim 12, wherein the method is for irradiating a user with medical and cosmetic radiation, the method comprising irradiating the user with a plurality of irradiation modules for irradiation with medical and cosmetic radiation, which modules are selected from the group comprising fluorescent tubes, LEDs, organic LEDs, and high-pressure lamps, wherein the irradiation modules emit only a partial spectrum of the medical and cosmetic radiation, wherein a user sensor is provided which detects the body characteristics of the user, and in that the irradiation modules can be actuated by the controller with operating parameters, which adapt the emitted radiation to detected body characteristics, in response to body characteristics detected by the user sensor.

16. The method of claim 15, wherein the user sensor determines the characteristics of the body, selected from the height, the width, and the circumference; and, position, intensity, or both of the irradiation modules is adapted to the detected characteristics.

17. The method of claim 15, wherein the user sensor detects the position and/or the type of skin characteristics of the body of the user, selected from the group comprising tattoos, burns, wounds, birthmarks, scars, white spots, pigment aberrations, tanning, and skin type; and in that the position and/or the intensity of the irradiation modules is adapted to the detected skin characteristics.

18. The method of claim 12, wherein the irradiation modules comprise LEDs, which are at least intermittently operated in a pulsed manner.

19. The device of claim 1, comprising:
the housing part comprising:
a lower housing part having a reclining surface configured for the user to recline upon,
an upper housing part pivotally connected to the lower housing part, the upper housing part configured to be pivoted downward upon the lower housing part to form a tunnel-like tube in which the user reclines; and
wherein irradiation modules of the plurality of irradiation modules are arranged within the lower housing part and upper housing part.

20. The device of claim 19, wherein the lower housing part comprises:
a vertical section positioned at a first end of the reclining surface, wherein irradiation modules of the plurality of irradiation modules are arranged within the vertical section; and
shoulder-tanning equipment positioned at a second end to the reclining surface, wherein irradiation modules of the plurality of radiation modules are arranged within the shoulder-tanning equipment.

21. The device of claim 1, wherein each irradiation module of the plurality of irradiation modules comprises:

a cooling body connected to the heat transfer plate via first and second cooling lines; and a cooling fluid configured to circulate through the heat transfer plate, the first and second cooling lines and the cooling body.

* * * * *